United States Patent [19]

Ishihara et al.

[11] Patent Number: 5,378,987
[45] Date of Patent: Jan. 3, 1995

[54] METHOD AND APPARATUS FOR NON-INVASIVE MEASUREMENT OF TEMPERATURE DISTRIBUTION WITHIN TARGET BODY USING NUCLEAR MAGNETIC RESONANCE IMAGING

[75] Inventors: Yasutoshi Ishihara; Kozo Sato, both of Kanagawa, Japan

[73] Assignee: Kabushiki Kaisha Toshiba, Kawasaki, Japan

[21] Appl. No.: 29,565

[22] Filed: Mar. 11, 1993

[30] Foreign Application Priority Data

Mar. 13, 1992 [JP] Japan ................. 4-055257

[51] Int. Cl.$^6$ ............................................. G01V 3/00
[52] U.S. Cl. ................................. 324/315; 128/653.2
[58] Field of Search ............... 324/315, 307, 309, 300; 128/653.2

[56] References Cited

U.S. PATENT DOCUMENTS

| | | | |
|---|---|---|---|
| 4,558,279 | 12/1985 | Ackerman et al. | 324/315 |
| 5,207,222 | 5/1993 | Koizumi et al. | 324/315 |

FOREIGN PATENT DOCUMENTS

| | | |
|---|---|---|
| 14900/83 | 5/1983 | Australia . |
| 0095124 | 11/1983 | European Pat. Off. . |
| 0122000 | 10/1984 | European Pat. Off. . |
| 59-196431 | 11/1984 | Japan . |
| 62-81538 | 4/1987 | Japan . |
| WO90/02321 | 3/1990 | WIPO . |

OTHER PUBLICATIONS

Hindman, "Proton Resonance Shift of Water in the Gas and Liquid States", *The Journal of Chemical Physics*, 44: pp. 4582–4592, (1966).

Vidrine et al, "Feedback Excitation Nuclear Magnetic Resonance Spectrometry and its Application to Simultaneous Temperature Measurement", *Analytical Chemistry*, vol. 50:293–303, (1978).

Hall et al., "Mapping of pH and Temperature Distribution Using Chemical–Shift–Resolved Tomography", *Journal of Magnetic Resonance*, vol. 65:501–505, (1985).

Lebihan et al, "Non–Invasive Temperature Mapping During Hyperthermia by MR Imaging of Molecular Diffusion", *Magnetic Resonance Imaging II*, pp.342–343.

*Primary Examiner*—Louis Arana
*Attorney, Agent, or Firm*—Foley & Lardner

[57] ABSTRACT

A non-invasive measurement of a temperature distribution within a target body using a nuclear magnetic resonance imaging, capable of realizing a high speed and a high precision measurement, and accounting for a displacement of the target body during the measurement. The chemical shift data from the target body at each voxel in an imaging target region on the target body are collected with and without a temperature change of the target body, a difference between the chemical shift data collected with the temperature change and the chemical shift data collected without the temperature change at each voxel, and a temperature distribution image is constructed and displayed according to the difference calculated. The chemical shift data are preferably collected by using a phase mapping imaging sequence.

18 Claims, 5 Drawing Sheets

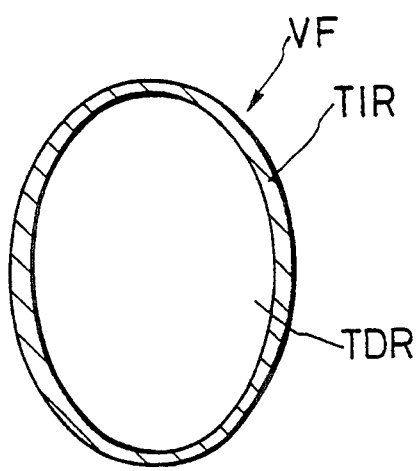
FIG.7
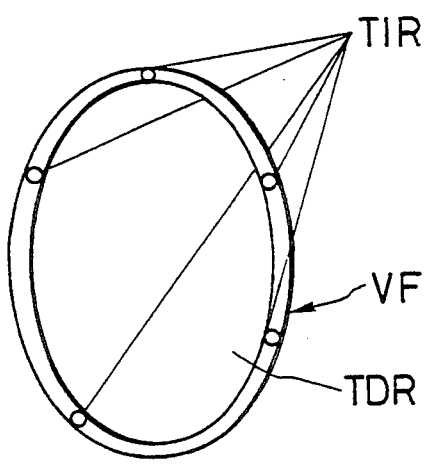
FIG.8
FIG.9
FIG.10
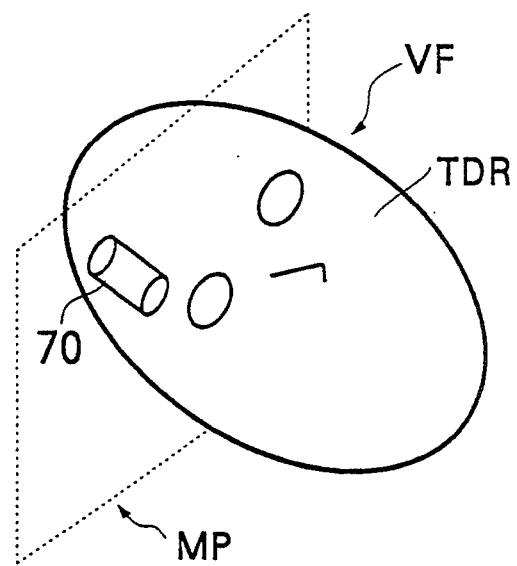
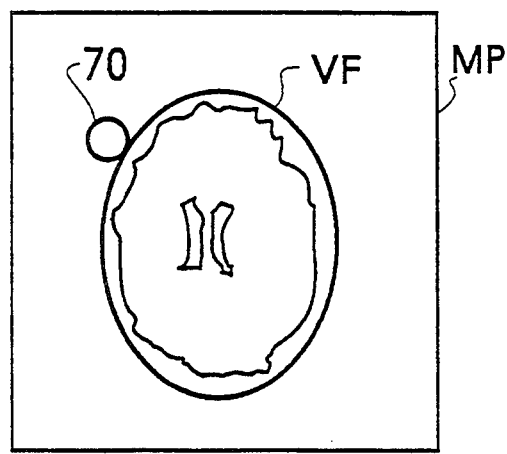

METHOD AND APPARATUS FOR NON-INVASIVE MEASUREMENT OF TEMPERATURE DISTRIBUTION WITHIN TARGET BODY USING NUCLEAR MAGNETIC RESONANCE IMAGING

BACKGROUND OF THE INVENTION

1. Field of the Invention

The present invention relates to a non-invasive measurement of a temperature distribution within a target body, which utilizes a nuclear magnetic resonance (NMR) imaging technique.

2. Description of the Background Art

In recent years, a need for developing a method for measuring a temperature distribution within a target body such as a living body non-invasively has been felt strongly in a wide range of medical fields including temperature measurement, tissue temperature measurement, and hyperthermia treatment.

This need is motivated by the fact that the temperature within the living body is a physical quantity which reflects many physiological functions of the living body, so that the information on the temperature distribution can be useful in diagnosing diseases such as circulation malfunction and tumors, as well as in monitoring the temperature change during the heating process used in hyperthermia treatment.

To this end, there has been several propositions to utilize the temperature dependent parameters of the NMR signals, such as a thermal equilibrium magnetization, longitudinal relaxation time, transverse relaxation time, and diffusion constant, for the purpose of the non-invasive measurement of the temperature distribution within a target body, which include the following representative cases.

(1) $M_0$: Thermal equilibrium magnetization

The thermal equilibrium magnetization $M_0$ is known to be inversely proportional to the temperature, as expressed by the following expression (1).

$$M_0 = N_0(T)\gamma^2 hB_0/4kT \tag{1}$$

where T is an absolute temperature, $N_0$ is a proton density, $\gamma$ is a gyromagnetic ratio, h is a Planck constant, k is a Boltzmann constant, and $B_0$ is a static magnetic field strength.

According to this expression (1), the temperature gradient of the thermal equilibrium magnetization $M_0$ for the proton system in pure water is $-0.36\%/K$ at the temperature of 40° C., so that the temperature can be estimated from the change of the thermal equilibrium magnetization $M_0$.

However, the temperature gradient of the thermal equilibrium magnetization $M_0$ takes a very small value, and the measurement must be made on a basis of the proton density image obtained by the NMR imaging, so that the very high precision measurement is required in order to achieve the sufficient temperature resolution and accuracy.

(2) $T_1$: Longitudinal relaxation time

When the speed of the molecular motion is quantified by a time constant $\tau_C$ of a correlation function concerning positions of protons, the longitudinal relaxation time $T_1$ can be approximately expressed by the following expressions (2) and (3).

$$T_1 \propto \omega_0^2 \eta(T)/T \text{ for } \omega_0\tau_C \gg 1 \tag{2}$$

$$T_1 \propto T/\eta(T) \text{ for } \omega_0\tau_C \ll 1 \tag{3}$$

where $\omega_0$ is a Larmor angular frequency and $\eta$ is a viscosity coefficient of the proton system.

Here, the temperature gradient is 2.2%/K for the proton system in pure water at the temperature of 40° C., which is larger than the temperature gradient of the thermal equilibrium magnetization $M_0$. Thus, the longitudinal relaxation time $T_1$ is a thermally more sensitive parameter than the thermal equilibrium magnetization $M_0$.

However, the use of this longitudinal relaxation time $T_1$ for the temperature measurement has been associated with the following problems.

First, it is necessary to measure the temperature dependency of each tissue in advance, because the ratio of the free water and the bound water and the difference of the viscosity affect the temperature dependency.

Secondly, in order to measure this longitudinal relaxation time $T_1$ at a precision of few %, it becomes necessary to pay a great amount of attention to the stability in the operation of the measurement system as a whole.

Thirdly, the measurement of the longitudinal relaxation time is quite time consuming.

(3) $T_2$: Transverse relaxation time

The transverse relaxation time can be expressed as a function of temperature, as in the following expressions (4) and (5).

$$T_2 \propto T/\eta(T) \text{ for } \omega_0\tau_C \gg 1 \tag{4}$$

$$T_2 = T_1 \propto T/\eta(T) \text{ for } \omega_0\tau_C \ll 1 \tag{5}$$

where $\omega_0$ is a Larmor angular frequency and $\eta$ is a viscosity coefficient of the proton system.

However, the use of this transverse relaxation time $T_2$ for the temperature measurement has been associated with the following problems.

First, it is necessary to measure the temperature dependency of each tissue in advance, because the ratio of the free water and the bound water and the difference of the viscosity affect the temperature dependency.

Secondly, in order to measure this transverse relaxation time $T_2$ at a precision of few %, it becomes necessary to pay a great amount of attention to the stability in the operation of the measurement system as a whole.

(4) D: Diffusion constant

The diffusion constant is known to have the temperature dependency expressed by the following expression (6).

$$D \propto \exp(-E/kT) \tag{6}$$

where E is an activation energy.

According to this expression (6), the temperature change $(T-T_0)$ can be determined from the diffusion constants $D_0$ and $D$ obtained before and after the temperature change, by the following expression (7).

$$(T-T_0) \approx (kT_0^2/E)[(D-D_0)/D_0] \tag{7}$$

However, such a use of this diffusion constant D for the temperature measurement is based on assumptions that $(T-T_0) \ll T_0$ and the activation energy is constant for each tissue, so that there are chances for the errors to be introduced due to the inaccuracy of these assumptions.

Furthermore, in such a conventional non-invasive measurement of the temperature distribution within a target body utilizing the temperature dependent parameters of the NMR signals, there has been a possibility for the measured temperature distribution to be spoiled by the error due to a displacement of the target body during the temperature measurement, especially when the target body is a living body, because the temperature dependency of the chemical shifts is substantially smaller compared with an inhomogeneity of the magnetic field caused by a body movement of the target body.

SUMMARY OF THE INVENTION

It is therefore an object of the present invention to provide a method and an apparatus for non-invasive measurement of a temperature distribution within a target body using a nuclear magnetic resonance imaging, capable of measuring the temperature distribution within a target body at a high speed and a high precision, and visualizing the measured temperature distribution.

It is another object of the present invention to provide a method and an apparatus for non-invasive measurement of a temperature distribution within a target body using a nuclear magnetic resonance imaging, capable of measuring the temperature distribution within a target body while accounting for a displacement of the target body during the temperature measurement.

According to one aspect of the present invention there is provided an apparatus for measuring temperature distribution in a target body, comprising: nuclear magnetic resonance imaging means for collecting chemical shift data from the target body at each voxel in an imaging target region on the target body, with and without a temperature change of the target body; calculation means for calculating a difference between the chemical shift data collected with the temperature change and the chemical shift data collected without the temperature change at each voxel; image construction means for constructing a temperature distribution image according to the difference calculated by the calculation means at each voxel: and display means for displaying the temperature distribution image constructed by the image construction means.

According to another aspect of the present invention there is provided a method of measuring temperature distribution in a target body, comprising the steps of: (a) collecting chemical shift data from the target body at each voxel in an imaging target region on the target body by nuclear magnetic resonance imaging means, with and without a temperature change of the target body; (b) calculating a difference between the chemical shift data collected at the step (a) with the temperature change and the chemical shift data collected at the step (a) without the temperature change at each voxel; (c) constructing a temperature distribution image according to the difference calculated at each voxel at the step (b); and (d) displaying the temperature distribution image constructed at the step (c).

Other features and advantages of the present invention will become apparent from the following description taken in conjunction with the accompanying drawings.

BRIEF DESCRIPTION OF THE DRAWINGS

FIG. 7 is a diagrammatic illustration of an example of the imaging target view field to be used in the imaging sequence of FIG. 6 containing the temperature independent region.

FIG. 8 is a diagrammatic illustration of another example of the imaging target view field to be used in the imaging sequence of FIG. 6 containing the temperature independent points.

FIG. 9 is a diagrammatic illustration of another example of the imaging target view field to be used in the imaging sequence of FIG. 6 containing a phantom made of the temperature independent chemical shift components.

FIG. 10 is an illustration of an NMR image obtained by using the imaging target view field of FIG. 9 at a measurement plane indicated in FIG. 9.

DETAILED DESCRIPTION OF THE PREFERRED EMBODIMENTS

Figure 1:
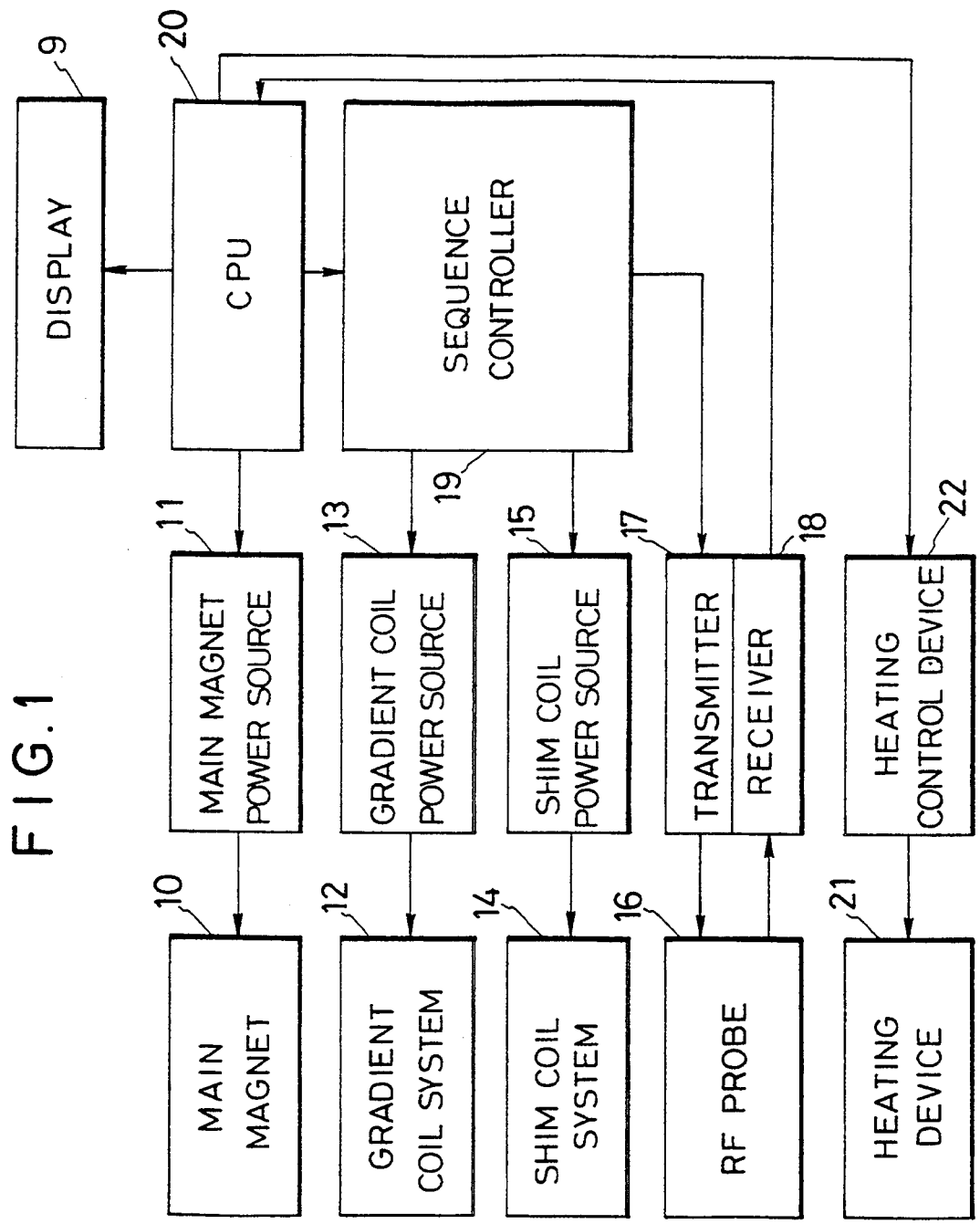
FIG. 1 is a schematic block diagram of one embodiment of a nuclear magnetic resonance imaging apparatus having a non-invasive temperature distribution measurement function according to the present invention.

Referring now to FIG. 1, one embodiment of a method and an apparatus for non-invasive measurement of a temperature distribution within a target body using a nuclear magnetic resonance imaging according to the present invention will be described in detail.

FIG. 1 schematically shows a configuration of a nuclear magnetic resonance imaging apparatus having a non-invasive temperature distribution measurement function.

In this configuration of FIG. 1, the apparatus comprises: a main magnet 10 for generating a static magnetic field in which a target body such as a living body as a measurement target is placed; a main magnet power source 11 for driving the main magnet 10 appropriately; gradient coil system 12 for generating gradient magnetic fields in three mutually orthogonal directions (X, Y, and Z directions) in superposition to the static magnetic field; a gradient coil power source 13 for driving the gradient coil system 12 appropriately; a shim coil system 14 for adjusting the homogeneity of the static magnetic field generated by the main magnet 10; a shim coil power source 15 for driving the shim coil system 14 appropriately; an RF (radio frequency) probe 16 for applying RF pulses to the target body and detecting NMR signals emitted from the target body in response to the application of the RF pulses; a transmitter 17 for supplying appropriate RF pulses to the RF probe 16; a receiver 18 for receiving, amplifying, and collecting the NMR signals detected by the RF probe 16; a sequence controller 19 for controlling the gradient coil power source 13, the shim coil power source 15, and the transmitter 17 to realize appropriate imaging sequence; a CPU 20 for controlling the operation of the apparatus as a whole, as well as reconstructing the NMR images from the NMR signals collected by the receiver 18; a heating device 21 for heating the target body in the hyperthermia treatment; a heating control device 22 for driving the heating device 21 appropriately; and a display 9 for displaying the NMR images reconstructed by the CPU 20.

Now, the principle behind the non-invasive measurement of a temperature distribution within a target body according to the present invention will be described.

The present invention utilizes the known fact that the hydrogen bond strength dependent on temperature can affect the shielding constant related to the chemical shift, so that the temperature can be determined from the change of the chemical shift for the hydrogen bonded hydroxy radical (—OH). For example, it is known that the chemical shift for the hydroxy radical (—OH), such as the hydroxy radical (—OH) in pure water, the hydroxy radical (—OH) with respect to the methyl radical (—CH$_3$) in the methanol (CH$_3$OH), and the hydroxy radical (—OH) with respect to the methylene radical (—CH$_2$—) in ethylene glycol (HO—CH$_2$—CH$_2$—OH), is proportional to the temperature by an amount of approximately $-0.01$ ppm/°C., regardless of the chemical shift measurement target object containing the hydroxy radical (—OH). (See, J. C. Hindman, Journal of Chemical Physics, Vol. 44, No. 12, pp. 4582–4592, 1966.)

Thus, the temperature can be calculated from the result of the chemical shift measurement by establishing the relationship between the chemical shift data and the temperatures in advance.

Figure 2:
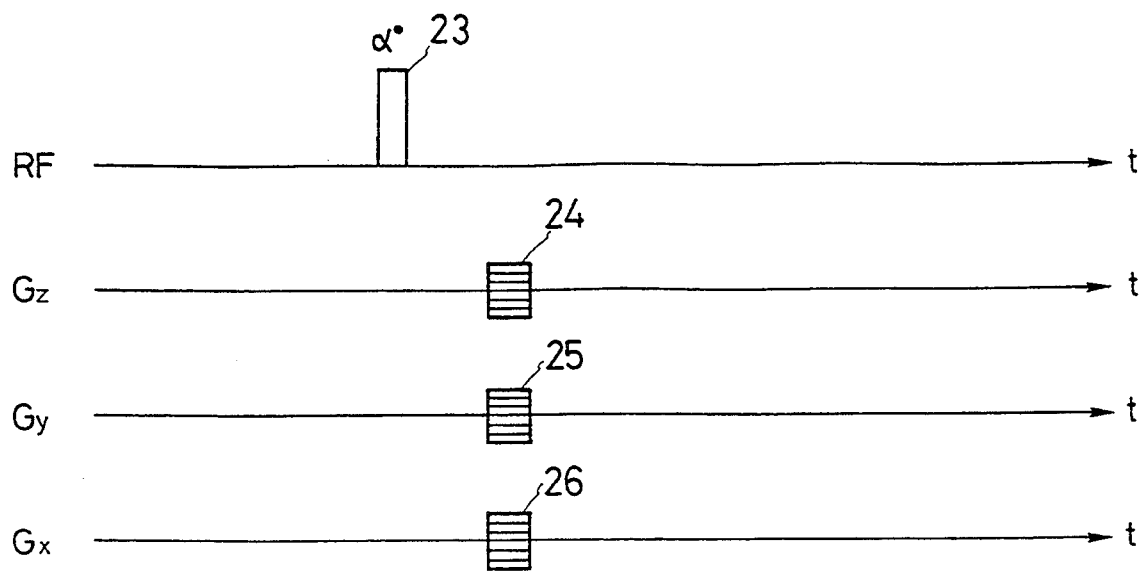
FIG. 2 is an imaging sequence diagram for a 4D-MRSI (4-Dimensional Magnetic Resonance Spectroscopic Imaging) sequence suitable for the chemical shift measurement to be made by the apparatus of FIG. 1.

In this embodiment, the chemical shift measurement is achieved in the apparatus of FIG. 1 by carrying out an imaging sequence called 4D-MRSI (4-Dimensional Magnetic Resonance Spectroscopic Imaging) sequence shown in FIG. 2, which is capable of obtaining the chemical shift data as well as the three-dimensional spatial data. In FIG. 2, the $\alpha°$ RF pulse 23 is applied by the RF probe 16 while the gradient magnetic fields 24, 25, and 26 in the Z, Y, and X directions, respectively, are generated by the gradient coil system 12, at the timings indicated in FIG. 2. It is also possible to utilize the imaging sequence for collecting the spectral data by successively switching the gradient magnetic fields, in order to realize a high speed data collection.

By using this imaging sequence of FIG. 2, the temperature change in the living body due to the heating applied by the heating device 21 can be determined from the measurements of the shifting of the spectral data for H$_2$O at each voxel, before and after the heating by the heating device 21.

Thus, when the hyperthermia treatment is carried out is by the heating device 21, the effect of the treatment can be judged non-invasively, by measuring the chemical shifts for H$_2$O at each voxel before and after the heating, calculating the difference between the chemical shifts at each voxel before and after the heating, and displaying the calculated differences for all voxels in a form of temperature distribution image on the display 9 in the apparatus of FIG. 1.

Figure 3:
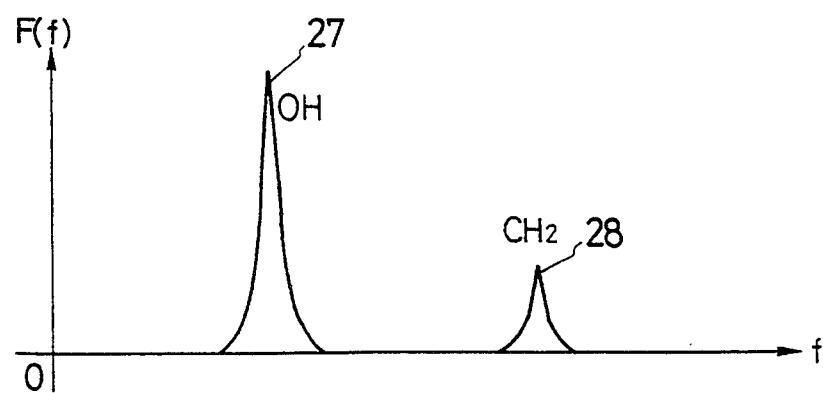
FIG. 3 is an illustration of an exemplary spectral data containing a temperature independent chemical shift component and a temperature dependent chemical shift component.

Here, in a case the measurement target portion in the target body is tissues containing $^1$H compounds such as brain tissues, the temperature independent chemical shift components such as CH$_2$ and CH$_3$ can be utilized as a reference for determining the absolute temperature, so that the temperature distribution image given in the absolute temperature can be displayed on the display 9 in the apparatus of FIG. 1. For example, in the spectral data shown in FIG. 3 which is obtained from a voxel in which the water component and the fat component are co-existing, the peak 28 for the methylene radical (—CH$_2$—) due to the fat component can be utilized as the reference for determining the absolute temperature for the peak 27 for the hydroxy radical (—OH) due to the water component.

As a result, it also becomes possible in this embodiment to diagnose the disease of the target body from the observation of the abnormality in the temperature distribution image given in the absolute temperature.

Figure 4:
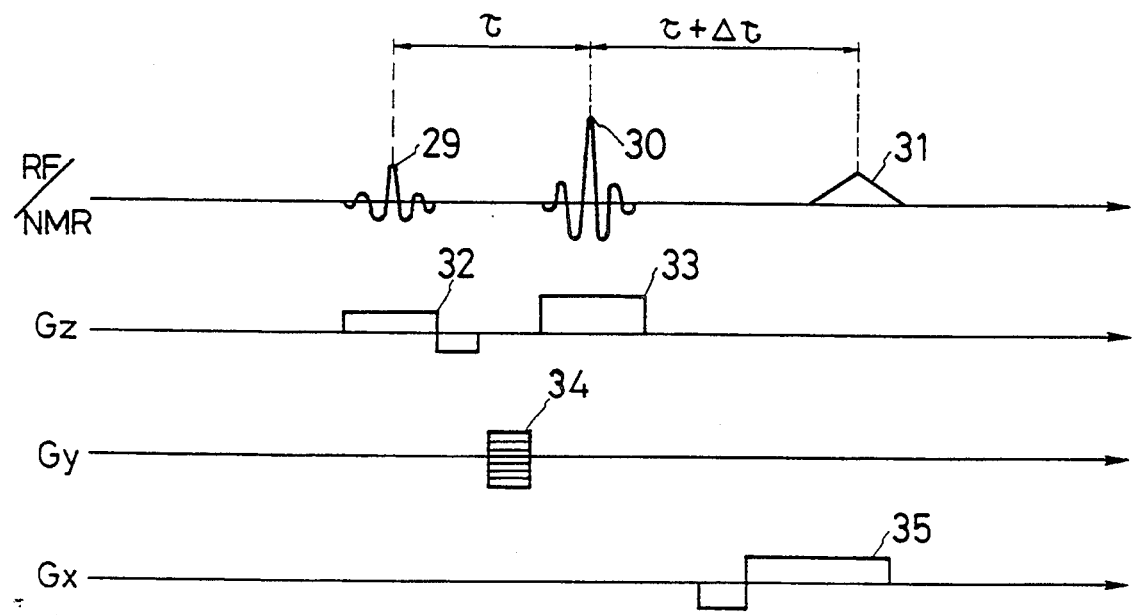
FIG. 4 is an imaging sequence diagram for a phase mapping spin echo sequence also suitable for the chemical shift measurement to be made by the apparatus of FIG. 1.

Alternatively, FIG. 4 shows another imaging sequence suitable for achieving the chemical shift measurement in the apparatus of FIG. 1, which utilizes the phase mapping technique. In this imaging sequence of FIG. 4, the phase mapping technique is applied to the spin echo sequence, as an illustrative example. In FIG. 4, the 90° RF pulse 29 and the 180° RF pulse 30 are applied by the RF probe 16 and the NMR echo signal 31 is detected by the RF probe 16, while the gradient magnetic fields 32, 33, 34 and 35 in the Z, Y, and X directions are generated by the gradient coil system 12, at the timings indicated in FIG. 4, where the 90° RF pulse 29 and the 180° RF pulse 30 are separated by a period $\tau$, while the 180° RF pulse 30 and the NMR echo signal 31 are separated by a period $\tau + \Delta\tau$.

Here, the phase difference $\theta(x, y, z)$ at each position $(x, y, z)$ between two NMR images obtained before and after the heating by the heating device 21 with different values for the period $\tau$ between the 90° RF pulse 29 and the 180° RF pulse 30 can be expressed by the following expression (8).

$$\theta(x, y, z) = \gamma \delta B(x, y, z) \Delta\tau \qquad (8)$$

where $\gamma$ is the gyromagnetic ratio and $\delta B(x, y, z)$ is a spatial deviation accounting for the inhomogeneity of the static magnetic field ($\delta B_H$), the chemical shift difference ($\delta B_C$), and the temperature dependency ($\delta B_T$), at each position $(x, y, z)$.

Thus, the spatial deviation distribution $\delta B(x, y, z)$ can be visualized in a form of a phase difference image according to this equation (8), from the measurements of the phase difference distribution $\theta_0(x, y, z)$ before the heating and the phase difference distribution $\theta_1(x, y, z)$ after the heating, and the phase difference image can be displayed on the display 9 in the apparatus of FIG. 1.

On the other hand, it is also possible to obtain the temperature change $\Delta T$ in which the influences of the inhomogeneity of the static magnetic field ($\delta B_H$) and the chemical shift difference ($\delta B_C$) are removed, from the measurements of the phase difference distribution $\theta_0(x, y, z)$ before the heating and the phase difference distribution $\theta_1(x, y, z)$ after the heating, according to the following expression (9).

$$\theta_1(x, y, z) - \theta_0(x, y, z) = \{[\delta B_H(x, y, z) + \delta B_C(x, y, z) + \delta B_{T1}(x, y, z)] - [\delta B_H(x, y, z) + \delta B_C(x, y, z) + \delta B_{T0}(x, y, z)]\}\gamma\Delta\tau = \gamma\Delta\tau[\delta B_{T1}(x, y, z) - \delta B_{T0}(x, y, z)] = \gamma\Delta\tau(\Delta T/\beta) \qquad (9)$$

where $\beta$ is a temperature dependency coefficient.

Thus, by visualizing the temperature change ΔT in a form of a phase difference image according to this equation (9) and displaying the phase difference image on the display 9 in the apparatus of FIG. 1, it also becomes possible to judge the effect of the hyperthermia treatment carried out by the heating device 21, non-invasively, just as in a case of using the imaging sequence of FIG. 2 described above.

Here, it is to be noted that, in a case the measurement target portion in the target body is tissues containing $^1H$ compounds such as brain tissues, the phase mapping image of the temperature independent chemical components such as $CH_2$ and $CH_3$ alone can be obtained by using the appropriate RF pulse sequences for selectively exciting or saturating only these temperature independent chemical shift components prior to the imaging sequence of FIG. 4, such that the temperature distribution image given in the absolute temperature can be calculated from difference between the phase mapping image for $H_2O$ and the phase mapping image for these temperature independent chemical shift components, and displayed on the display 9 in the apparatus of FIG. 1.

As a result, it also becomes possible to diagnose the disease of the target body from the observation of the abnormality in the temperature distribution image given in the absolute temperature, just as in a case of using the imaging sequence of FIG. 2 described above.

It is also to be noted that, in a case of using this imaging sequence of FIG. 4, any desired dynamic range can be set up by appropriately adjusting the value of $Δτ$ indicated in FIG. 4 according to the level of the temperature change to be measured, so that the precision in the measurement can be improved.

Figure 5:
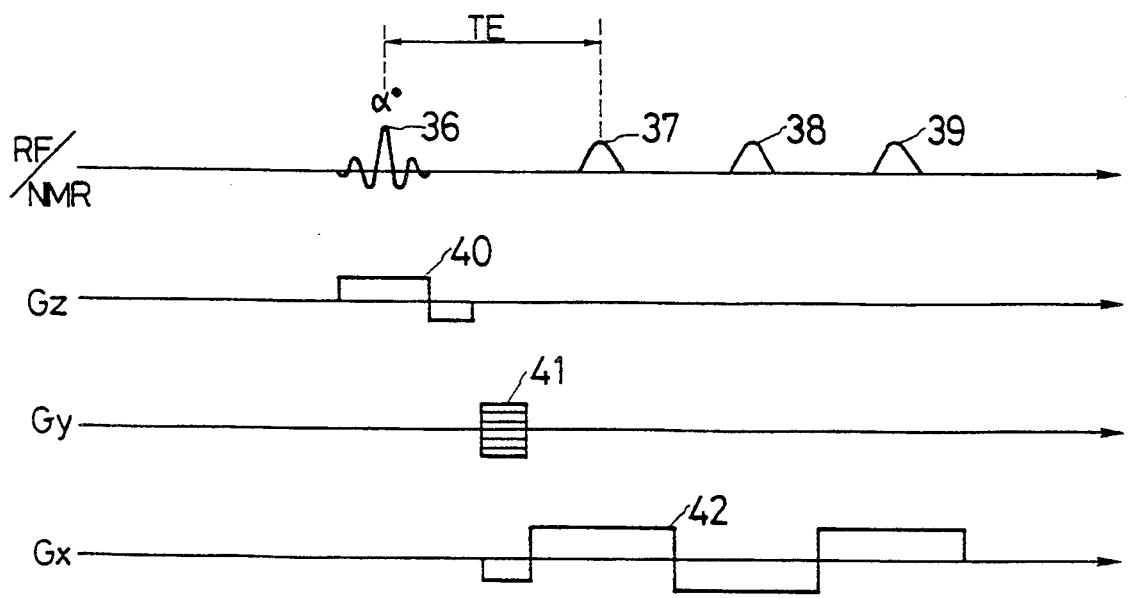
FIG. 5 is an imaging sequence diagram for a high speed imaging sequence also suitable for the chemical shift measurement to be made by the apparatus of FIG. 1.

It is also possible for this embodiment to utilize the imaging sequence shown in FIG. 5 in which the phase mapping technique is applied to the field echo sequence, as an illustrative example. In FIG. 5, the α° RF pulse 36 is applied by the RF probe 16 while the gradient magnetic fields 40 and 41 in the Z and Y directions are generated by the gradient coil system 12, and then the NMR echo signals 37, 38, and 39 are successively detected by the RF probe 16 while the gradient magnetic field 42 in the X direction which is successively switching its polarity is generated by the gradient coil system 12, such that a high speed data collection can be realized by the successive acquisition of the NMR echo signals 37, 38, and 39 in response to the successive switching of the polarity of the gradient magnetic field 42.

In this case, the expressions (8) and (9) described above should be rewritten in terms of a period TE between the α° RF pulse 36 and the NMR echo signal 37 as the following expressions (10) and (11), respectively.

$$\theta(x, y, z) = \gamma \delta B(x, y, z) TE \quad (10)$$

$$\Delta\theta = \gamma TE(\Delta T/\beta) \quad (11)$$

It is also possible for this embodiment to utilize the ultra high speed imaging sequence instead of the imaging sequences of FIG. 4 and FIG. 5.

It is to be noted that, in this embodiment, any desired number of the temperature independent chemical shift components may be used as references for determining the absolute temperature. In particular, the use of a plurality of the references is preferable in achieving the higher accuracy in the absolute temperature determination. In addition, the temperature independent chemical shift components located outside of the target body may also be utilized for this purpose.

It is also to be noted that the temperature distribution image of the target body obtained by this embodiment can be utilized for the diagnosis of the diseases such as the circulation malfunction and tumors.

Moreover, the temperature distribution image of the target body obtained by this embodiment may also be utilized in controlling the heating regions and the heating levels in the hyperthermia treatment.

Furthermore, it is also possible to correct the deviation of the chemical shift due to the temperature change by utilizing a plurality of pH dependent chemical shift radicals, from which the pH distribution in the target body can be obtained by using the NMR imaging.

As described, according to this embodiment, it becomes possible to provide a method and an apparatus for non-invasive measurement of a temperature distribution within a target body using a nuclear magnetic resonance imaging, capable of measuring the temperature distribution within a target body at a high speed and a high precision, and visualizing the measured temperature distribution.

Now, as already mentioned above, the temperature dependency of the chemical shifts is as small as an order of 0.01 ppm, which is substantially smaller compared with an inhomogeneity of the magnetic field that can be caused by a body movement of the target body, so that there is a possibility for the measured temperature distribution to be spoiled by the error due to a displacement of the target body during the temperature measurement, especially when the target body is a living body. This problem of the error due to a displacement of the target body can be resolved according to the present invention as follows.

Namely, the phase mapping images of a temperature independent region containing the temperature independent chemical shift components are also obtained before and after the heating, so as to detect the phase change due to the body movement of the target body according to these phase mapping images.

Figure 6:
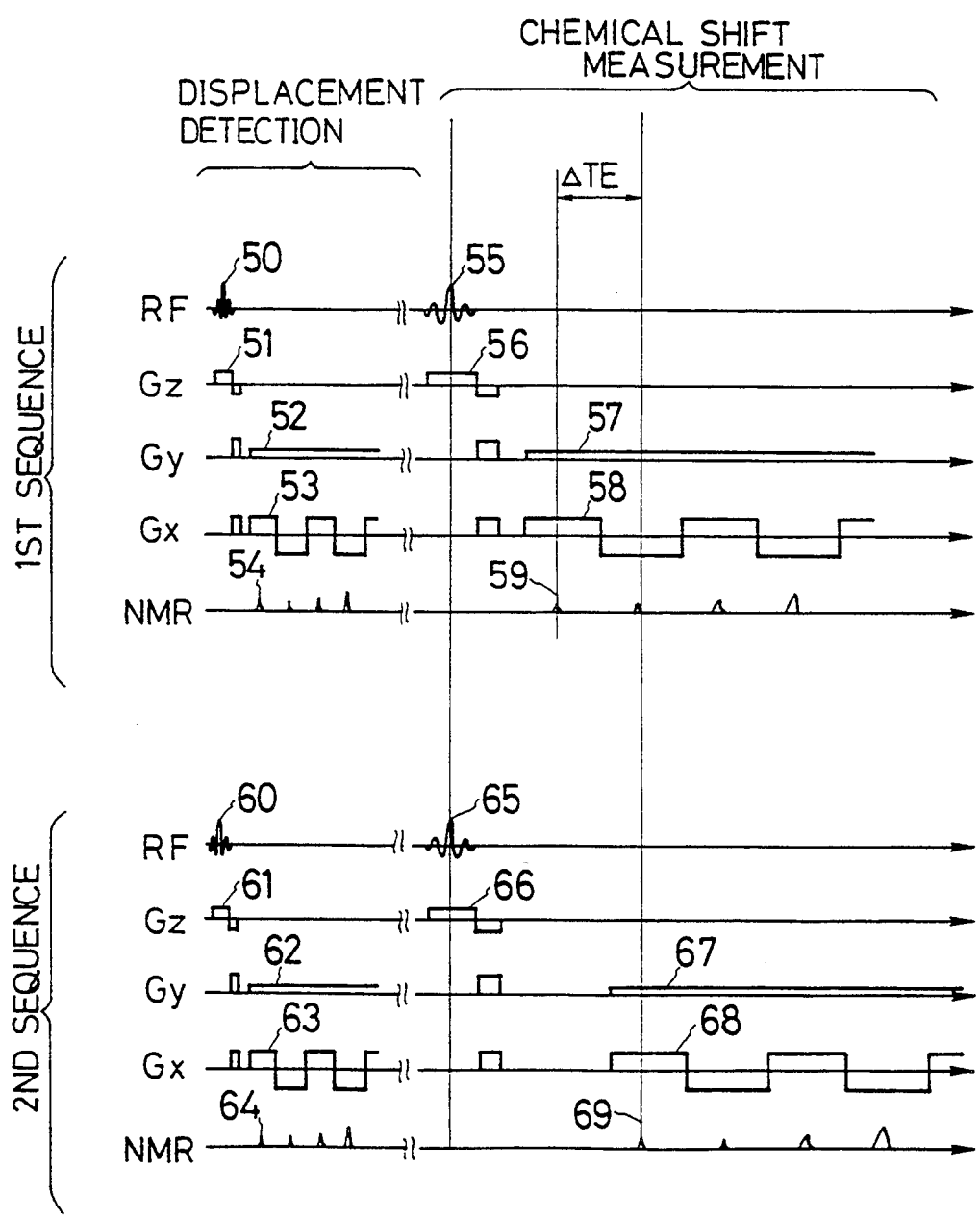
FIG. 6 is an imaging sequence diagram for an ultra high speed imaging sequence also suitable for the chemical shift measurement to be made by the apparatus of FIG. 1, in a case of detecting the body movement of the target body.

In this case, the chemical shift measurement in the apparatus of FIG. 1 can be achieved by utilizing the imaging sequence shown in FIG. 6 which includes, first and second sequences, each of which containing a displacement detection part and a chemical shift measurement part. In this imaging sequence of FIG. 6, the phase mapping technique is applied to the ultra high speed echo sequence.

In FIG. 6, in the displacement detection part, the RF pulse 50 (60) is applied by the RF probe 16 while the gradient magnetic fields 51 (61), 52 (62), and 53 (63) in the Z, Y, and X directions are generated by the gradient coil system 12 at timings indicated in FIG. 6, and then the NMR echo signals 54 (64) are successively detected by the RF probe 16 while the gradient magnetic field 53 (63) in the X direction which is successively switching its polarity is generated by the gradient coil system 12, such that an ultra high speed data collection can be realized by the successive acquisition of the NMR echo signals 54 (64) in response to the successive switching of the polarity of the gradient magnetic field 53 (63).

Then, in the chemical shift measurement part, the RF pulse 55 (65) is applied by the RF probe 16 while the gradient magnetic fields 56 (66), 57 (67), and 58 (68) in the Z, Y, and X directions are generated by the gradient coil system 12 at timings indicated in FIG. 6, and then the NMR echo signals 59 (69) are successively detected by the RF probe 16 while the gradient magnetic field 58 (68) in the X direction which is successively switching its polarity is generated by the gradient coil system 12, such that an ultra high speed data collection can be realized by the successive acquisition of the NMR echo signals 59 (69) in response to the successive switching of the polarity of the gradient magnetic field 58 (68).

The second sequence differs from the first sequence in that the echo time to be used in the chemical shift measurement part is displaced from the first sequence to the second sequence by $\Delta TE$ as indicated in FIG. 6, so as to obtain two sets of phase mapping images including a first phase mapping image obtained by the first sequence and a second phase mapping image obtained by the second sequence.

The entire imaging sequence shown in FIG. 6 is executed both before and after the heating. The phase difference at each voxel between the first phase mapping image and second phase mapping image is calculated in each execution of the imaging sequence of FIG. 6. Then, the difference image is calculated from the calculated phase differences obtained from the execution before the heating and the execution after the heating, and the calculated difference image is displayed on the display 9 in the apparatus of FIG. 1. Here, two sets of phase mapping images are used in order to remove the influence of the image shift in the encoding direction in the ultra high speed imaging sequence due to the change of the magnetic field distributions before and after the heating.

Then, the difference image obtained from the displacement detection part is utilized to detect the phase change due to the body movement of the target body.

Here, as shown in FIG. 7, the data can be collected in the displacement detection part from an entire imaging target view field VF which includes the temperature independent region TIR containing the temperature independent chemical shift components, along with the temperature dependent region TDR containing the temperature dependent chemical shift components whose chemical shifts are to be measured in the chemical shift measurement part.

Alternatively, as shown in FIG. 8, the data can be collected in the displacement detection part from predetermined number of temperature independent points TIP within the entire imaging target view field VF at which the temperature independent chemical shift components are located, by using a localized excitation technique. The use of the temperature independent points TIP will be advantageous in terms of a time required for the displacement detection part.

It is also possible, as shown in FIG. 9, to utilize a phantom 70 made of the temperature independent chemical shift components such as fat, which is to be attached to the measurement target body and placed within the entire imaging target view field VF along with the temperature dependent region TDR containing the temperature dependent chemical shift components whose chemical shifts are to be measured in the chemical shift measurement part. In this case, the NMR image taken at a measurement plane MP indicated in FIG. 9 appears as shown in FIG. 10 for example. Here, it is preferable for the phantom 70 to have a shape which can cause a large inhomogeneity to the static magnetic field when the target body moves, such that the phase change due to the body movement of the target body can be detected easily.

In a case the phase change due to the body movement of the target body is detected from the difference image, the data collected from this execution of the imaging sequence of FIG. 6 are possibly spoiled by the error due to the body movement of the target body, so that the imaging sequence of FIG. 6 may be executed again to obtain new data. In a case a series of data acquisitions is made consecutively, the data collected from this execution of the imaging sequence of FIG. 6 are not used for obtaining the difference image with respect to the data collected earlier, but used as a reference for the subsequent data to be collected by the subsequent data acquisitions.

On the other hand, when the phase change due to the body movement of the target body is detected from the difference image, it is also possible to adjust the strength of the gradient magnetic fields determining the imaging target region in the target body to displace the imaging target region such that the phase change in the difference image can be nullified. In other words, by sequentially displacing the imaging target region by the appropriate adjustment of the gradient magnetic fields, it is possible to find the optimum imaging target region in which the phase change in the difference image can be nullified.

Thus, when the phase change due to the body movement of the target body is detected from the difference image, the imaging target region may be displaced sequentially to find the optimum imaging target region in which the phase change in the difference image can be nullified, and the subsequent data acquisitions may be made with respect to this optimum imaging target region.

As described, according to this embodiment, it also becomes possible to realize a non-invasive measurement of a temperature distribution within a target body using a nuclear magnetic resonance imaging, accounting for a displacement of the target body during the temperature measurement.

It is to be noted that it is not absolutely necessary to place the displacement detection part in front of the chemical shift measurement part in the imaging sequence of FIG. 6, so that the displacement detection part may be placed behind the chemical shift measurement part in the imaging sequence of FIG. 6, if desired.

It is also to be noted that, besides those already mentioned above, many modifications and variations of the above embodiment may be made without departing from the novel and advantageous features of the present invention. Accordingly, all such modifications and variations are intended to be included within the scope of the appended claims.

What is claimed is:

1. An apparatus for measuring temperature distribution in a target body, comprising:

nuclear magnetic resonance imaging means for collecting chemical shift data from the target body at each voxel in an imaging target region in the target body, with and without a temperature change of the target body using a phase mapping imaging sequence;

calculation means for calculating a difference between the chemical shift data collected with the temperature change and the chemical shift data collected without the temperature change at each voxel as a phase difference at each voxel between the chemical shift data collected with and without the temperature change;

image construction means for constructing a temperature distribution image according to the difference calculated by the calculation means at each voxel by converting the phase difference at each voxel calculated by the calculation means into a corresponding temperature; and display means for displaying the temperature distribution image constructed by the image construction means.

2. The apparatus of claim 1, wherein the nuclear magnetic resonance imaging means collects the chemical shift data for at least one temperature dependent chemical component in the target body after and before the temperature change of the target body, as the chemical shift data with and without the temperature change, respectively.

3. The apparatus of claim 1, wherein the nuclear magnetic resonance imaging means collects the chemical shift data for at least one temperature dependent chemical component and at least one temperature independent chemical shift component in the target body, as the chemical shift data with and without the temperature change, respectively.

4. The apparatus of claim 1, wherein the phase mapping imaging sequence used by the nuclear magnetic resonance imaging means is any one of a phase mapped spin echo sequence, a phase mapped field echo sequence, and a phase mapped ultra high speed imaging sequence in which a plurality of nuclear magnetic resonance signals are collected from the target body in response to repeated reversals of a polarity of a reading gradient magnetic field.

5. The apparatus of claim 1, wherein the imaging target region contains a temperature independent portion and the apparatus further comprises:

displacement detection means for detecting a displacement of the target body between a collection of the chemical shift data with the temperature change and a collection of the chemical shift data without the temperature change according to a phase change in the chemical shift data collected from the temperature independent portion of the imaging target region with and without the temperature change.

6. The apparatus of claim 5, wherein the nuclear magnetic resonance imaging means carries out the phase mapping imaging sequence for collecting the chemical shift data for the temperature independent portion separately from the phase mapping imaging sequence for collecting the chemical shift data for a temperature dependent portion in the imaging target region.

7. The apparatus of claim 5, wherein the temperature independent portion in the imaging target region is provided by a phantom made of temperature independent chemical shift components which is attached to the target body and placed inside the imaging target region.

8. The apparatus of claim 5, further comprising:

means for adjusting strengths of gradient magnetic fields used by the nuclear magnetic resonance imaging means, when the displacement detection means detects the displacement, to shift the imaging target region sequentially to a position at which the phase change is nullified.

9. The apparatus of claim 1, wherein the nuclear magnetic resonance imaging means collects two sets of each of the chemical shift data with and without the temperature change, by using a phase mapped echo sequence with different echo times; and wherein the calculation means takes a first phase difference between the two sets of the chemical shift data collected with the temperature change and a second phase difference between the two sets of the chemical shift data collected without the temperature change, and calculates a difference between the first phase difference and the second phase difference as the difference between the chemical shift data collected with and without the temperature change at each voxel.

10. A method of measuring temperature distribution in a target body, comprising the steps of:

(a) collecting chemical shift data from the target body at each voxel in an imaging target region in the target body with a nuclear magnetic resonance imaging unit, with and without a temperature change of the target body, using a phase mapping imaging sequence;

(b) calculating a difference, between the chemical shift data collected at the step (a) with the temperature change and the chemical shift data collected at the step (a) without the temperature change at each voxel, as a phase difference at each voxel between the chemical shift data collected with and without the temperature change;

(c) constructing a temperature distribution image according to the difference calculated at each voxel at the step (b), by converting the phase difference at each voxel calculated at the step (b) into a corresponding temperature; and (d) displaying the temperature distribution image constructed at the step (c).

11. The method of claim 10, wherein at the step (a), the nuclear magnetic resonance imaging unit collects the chemical shift data for at least one temperature dependent chemical component in the target body after and before the temperature change of the target body, as the chemical shift data with and without the temperature change, respectively.

12. The method of claim 10, wherein at the step (a), the nuclear magnetic resonance imaging unit collects the chemical shift data for at least one temperature dependent chemical component and at least one temperature independent chemical shift component in the target body, as the chemical shift data with and without the temperature change, respectively.

13. The method of claim 10, wherein at the step (a), the phase mapping imaging sequence used by the nuclear magnetic resonance imaging unit is any one of a phase mapped spin echo sequence, a phase mapped field echo sequence, and a phase mapped ultra high speed imaging sequence in which a plurality of nuclear magnetic resonance signals are collected from the target body in response to repeated reversals of a polarity of a reading gradient magnetic field.

14. The method of claim 10, wherein the imaging target region contains a temperature independent portion and the method further comprises the step of:

(e) detecting a displacement of the target body between a collection of the chemical shift data with the temperature change and a collection of the chemical shift data without the temperature change according to a phase change in the chemical shift data collected from the temperature independent portion of the imaging target region with and without the temperature change.

15. The method of claim 14, wherein at the step (a), the nuclear magnetic resonance imaging unit carries out the phase mapping imaging sequence for collecting the chemical shift data for the temperature independent portion separately from the phase mapping imaging sequence for collecting the chemical shift data for a temperature dependent portion in the imaging target region.

16. The method of claim 14, wherein the temperature independent portion in the imaging target region is provided by a phantom made of temperature independent chemical shift components which is attached to the target body and placed inside the imaging target region.

17. The method of claim 14, further comprising the step of:
(f) adjusting strengths of gradient magnetic fields used by the nuclear magnetic resonance imaging unit at the step (a), when the displacement is detected at the step (e), to shift the imaging target region sequentially to a position at which the phase change is nullified.

18. The method of claim 10, wherein at the step (a), the nuclear magnetic resonance imaging unit collects two sets of each of the chemical shift data with and without the temperature change, by using a phase mapped echo sequence with different echo times; and at the step (b), a first phase difference between the two sets of the chemical shift data collected with the temperature change and a second phase difference between the two sets of the chemical shift data collected without the temperature change are taken, and a difference between the first phase difference and the second phase difference is calculated as said difference between the chemical shift data collected with and without the temperature change at each voxel.

* * * * *